(12) United States Patent
Lin

(10) Patent No.: US 6,736,896 B2
(45) Date of Patent: May 18, 2004

(54) GAS SPRAY ARM FOR SPIN COATING APPARATUS

(75) Inventor: Keng-Ching Lin, Taipei (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 36 days.

(21) Appl. No.: 10/268,426

(22) Filed: Oct. 10, 2002

(65) Prior Publication Data

US 2004/0069215 A1 Apr. 15, 2004

(51) Int. Cl.⁷ .................................................. B05C 5/00
(52) U.S. Cl. .................... 118/52; 118/730; 118/313; 118/315; 118/320; 239/450; 427/255.23; 427/425; 427/426; 427/240
(58) Field of Search ................... 118/730, 52, 313, 118/315, 320; 427/240, 255.23, 255.5, 425, 426

(56) References Cited

U.S. PATENT DOCUMENTS 5,350,452 A * 9/1994 Rempe et al. .............. 118/669
5,772,764 A * 6/1998 Akimoto ..................... 118/319
5,849,084 A * 12/1998 Hayes et al. ................ 118/320
5,942,035 A * 8/1999 Hasebe et al. ............... 118/52

* cited by examiner

Primary Examiner—J. A. Lorengo
Assistant Examiner—Michelle Acevedo Lazor
(74) Attorney, Agent, or Firm—Tung & Associates

(57) ABSTRACT

A multi-nozzle gas spray arm for a spin coating apparatus. In a typical embodiment, the invention comprises a primary spray arm and a secondary spray arm which is confluently connected to the primary spray arm. The primary spray arm ejects a narrow, relatively high-velocity nitrogen stream against a substrate while the secondary spray arm ejects a diffuse, relatively low-velocity nitrogen stream against the substrate as the gas spray arm is typically swept across the surface of the wafer. The diffuse nitrogen flow characteristic of the nitrogen ejected from the secondary spray arm is effective in eliminating water and chemical droplets which otherwise would tend to remain and form dry spots on the wafer surface.

12 Claims, 2 Drawing Sheets

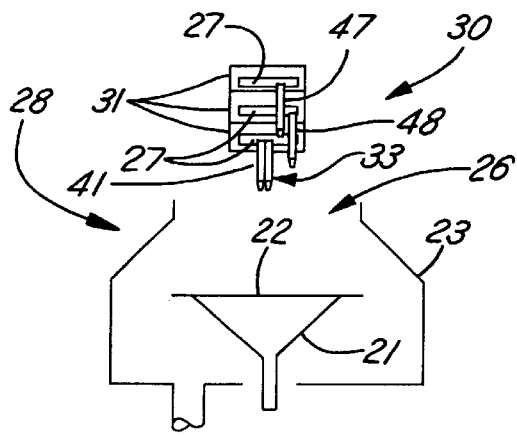
FIG. 5
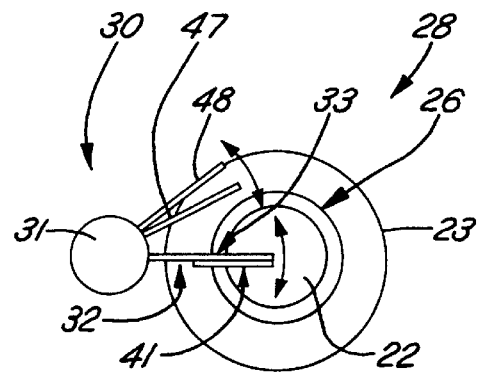
FIG. 6
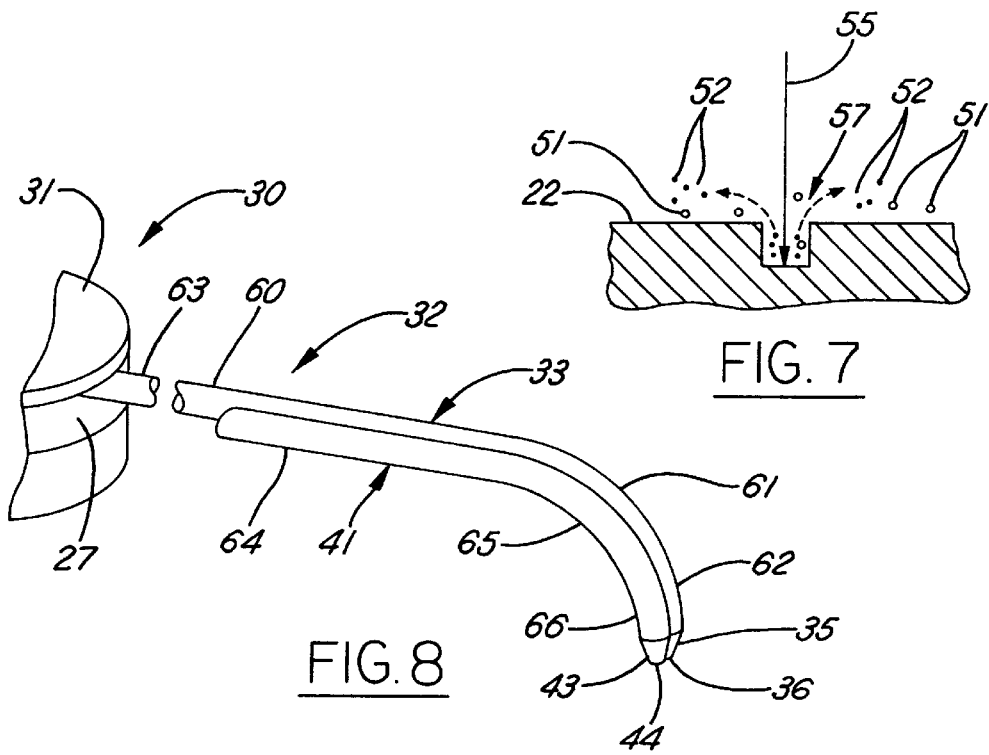
FIG. 7
FIG. 8

GAS SPRAY ARM FOR SPIN COATING APPARATUS

FIELD OF THE INVENTION

The present invention relates to spin coating apparatus used to coat a photoresist on a semiconductor wafer substrate in the fabrication of semiconductor integrated circuits. More particularly, the present invention relates to a new and improved gas purge arm which facilitates a diffuse spray pattern of nitrogen purge gas against a substrate surface after a photoresist coating process in a spin coating apparatus.

BACKGROUND OF THE INVENTION

The fabrication of various solid state devices requires the use of planar substrates, or semiconductor wafers, on which integrated circuits are fabricated. The final number, or yield, of functional integrated circuits on a wafer at the end of the IC fabrication process is of utmost importance to semiconductor manufacturers, and increasing the yield of circuits on the wafer is the main goal of semiconductor fabrication. After packaging, the circuits on the wafers are tested, wherein non-functional dies are marked using an inking process and the functional dies on the wafer are separated and sold. IC fabricators increase the yield of dies on a wafer by exploiting economies of scale. Over 1000 dies may be formed on a single wafer which measures from six to twelve inches in diameter.

Various processing steps are used to fabricate integrated circuits on a semiconductor wafer. These steps include deposition of a conducting layer on the silicon wafer substrate; formation of a photoresist or other mask such as titanium oxide or silicon oxide, in the form of the desired metal interconnection pattern, using standard lithographic or photolithographic techniques; subjecting the wafer substrate to a dry etching process to remove the conducting layer from the areas not covered by the mask, thereby etching the conducting layer in the form of the masked pattern on the substrate; removing or stripping the mask layer from the substrate typically using reactive plasma and chlorine gas, thereby exposing the top surface of the conductive interconnect layer; and cooling and drying the wafer substrate by applying water and nitrogen gas to the wafer substrate.

The numerous processing steps outlined above are used to cumulatively apply multiple electrically conductive and insulative layers on the wafer and pattern the layers to form the circuits. The final yield of functional circuits on the wafer depends on proper application of each layer during the process steps. Proper application of those layers depends, in turn, on coating the material in a uniform spread over the surface of the wafer in an economical and efficient manner.

During the photolithography step of semiconductor production, light energy is applied through a reticle mask onto a photoresist material previously deposited on the wafer to define circuit patterns which will be etched in a subsequent processing step to define the-circuits on the wafer. Because these circuit patterns on the photoresist represent a two-dimensional configuration of the circuit to be fabricated on the wafer, minimization of particle generation and uniform application of the photoresist material to the wafer are very important. By minimizing or eliminating particle generation during photoresist application, the resolution of the circuit patterns, as well as circuit pattern density, is increased.

Photoresist materials are coated onto the surface of a wafer by dispensing a photoresist fluid typically on the center of the wafer as the wafer rotates at high speeds within a stationary bowl or coater cup of a spin coating apparatus. The coater cup catches excess fluids and particles ejected from the rotating wafer during application of the photoresist. The photoresist fluid dispensed onto the center of the wafer is spread outwardly toward the edges of the wafer by surface tension generated by the centrifugal force of the rotating wafer. This facilitates uniform application of the liquid photoresist on the entire surface of the wafer.

Spin coating of photoresist on wafers is carried out in an automated track system using wafer handling equipment which transport the wafers between the various photolithography operation stations, such as vapor prime resist spin coat, develop, baking and chilling stations. Robotic handling of the wafers minimizes particle generation and wafer damage. Automated wafer tracks enable various processing operations to be carried out simultaneously. Two types of automated track systems widely used in the industry are the TEL (Tokyo Electron Limited) track and the SVG (Silicon Valley Group) track.

A typical conventional spin coating apparatus for coating semiconductor wafers with a photoresist liquid is generally indicated by reference numeral 8 in FIGS. 1 and 2. The spin coating apparatus 8 includes a coater cup 3 which includes a top opening 6 and partially encloses a wafer support stage or chuck 1 on which is supported the wafer 2. A chemical dispensing system 10 includes a nitrogen gas spray arm 12, an acid dispensing arm 13 and a deionized (DI) water spray arm 14, each of which extends from a corresponding arm slot 7 in an arm mount 11. As shown in FIG. 2, each of the arms 12, 13, 14 is capable of swinging or pivoting from a stored position on the side of the coater cup 3, over the top of the coater cup 3 for dispensing the corresponding liquid through the top opening 6 onto the wafer 2. In operation, the chuck 1 rotates the wafer 2 at high speeds, typically as high as 4,000 rpm, either after or as the liquid photoresist (not shown) is dispensed onto the center of the spinning wafer 2, through the top opening 6. By operation of centrifugal force imparted to the wafer 2 by the rotating chuck 1, the dispensed photoresist liquid is spread across and uniformly coated on the surface of the wafer 2. Exhaust solvent gases and photoresist particles generated during the process are vented from the coater cup 3 through an exhaust pipe 4 which may be connected to an exhaust manifold 5.

After the liquid photoresist is applied to the wafer 2, the acid dispensing arm 13 sweeps over the center of the coater cup 3 and back to the "home" position on the side of the coater cup 3 as acid is dispensed from the arm 13 through the top opening 6 onto the surface of the spinning wafer 2 at a pressure of typically about 0.3 psi. This step removes excess photoresist, as well as photoresist particles, from the wafer 2. Next, the water spray arm 14 sweeps over the center of the coater cup 3 and back to the "home" position on the side of the coater cup 3 to spray DI water, at a pressure of typically about 20–40 psi, through the top opening 6 and onto the wafer 2 to remove residual acid from the wafer 2. Finally, the nitrogen gas spray arm 12 is initially positioned over the center of the coater cup 3 and then sweeps back to the "home" position on the side of the coater cup 3 to blow nitrogen gas, at a pressure of typically about 15 psi, onto the surface of the spinning wafer 2. This final step dries most of the DI water remaining on the wafer 2.

As shown in FIG. 3, the nitrogen spray arm 12 includes a central dispensing tube 15 that terminates in a nozzle opening 16 at the end of the nitrogen spray arm 12. The nozzle opening 16 typically has a relatively small diameter of about 1.0 mm to about 1.5 mm, and this tends to eject the nitrogen gas onto the surface of the wafer 2 in a narrow, forceful stream 18. The nitrogen gas stream 18 tends to blow or splash water droplets 17 from localized areas on the surface of the wafer 2 contacted directly by the nitrogen gas stream 18 while spreading the water droplets 17 to adjacent areas on the wafer 2. Consequently, some of the water droplets 17 remain on the wafer 2, forming chemical and water spots on the surface of the wafer 2 after the cleaning process. Chemical and water spots remaining on the wafer 2 after the photoresist application process tend to adversely affect device performance and reduce the yield of devices on the wafer 2.

SUMMARY OF THE INVENTION

An object of the present invention is to provide a gas spray arm which is capable of applying a drying gas in a diffuse pattern to the surface of a substrate.

Another object of the present invention is to provide a gas spray arm which is effective in drying water and chemicals from a substrate.

Still another object of the present invention is to provide a gas spray arm for preventing the formation of water or chemical spots on a substrate after a process is carried out on the substrate typically in a spin coating apparatus.

Another object of the present invention is to provide a multi-nozzle gas spray arm which includes at least two spray arms for ejecting a gas, particularly nitrogen, against a substrate to remove water or other liquid droplets from the substrate.

Yet another object of the present invention is to provide a multi-nozzle gas spray arm for drying liquid from a substrate and preventing the formation of water or liquid spots on the substrate.

A still further object of the present invention is to provide a multi-nozzle gas spray arm which combines a high-pressure, narrow gas stream with a lower-pressure, diffuse gas stream to facilitate effective drying of a substrate surface.

In accordance with these and other objects and advantages, the present invention is directed to a multi-nozzle gas spray arm for a spin coating apparatus, which multi-nozzle gas spray arm in a typical embodiment comprises a primary spray arm and a secondary spray arm which is confluently connected to the primary spray arm. The primary spray arm ejects a narrow, relatively high-velocity nitrogen stream against a substrate while the secondary spray arm ejects a diffuse, relatively low-velocity nitrogen stream against the substrate as the gas spray arm is typically swept across the surface of the wafer. The diffuse nitrogen flow characteristic of the nitrogen ejected from the secondary spray arm is effective in eliminating water and chemical droplets which otherwise would tend to remain and form dry spots on the wafer surface.

BRIEF DESCRIPTION OF THE DRAWINGS

The invention will now be described, by way of example, with reference to the accompanying drawings, in which:

FIG. 5 is a schematic view of a spin coating apparatus in implementation of the present invention;

FIG. 6 is a top view of the spin coating apparatus of FIG. 5;

FIG. 7 illustrates removal of particles and water droplets from a via or other aperture formed in the surface of a substrate in implementation of the present invention; and FIG. 8 is a perspective view, partially in section, of an illustrative embodiment of the gas spray arm of the present invention.

DESCRIPTION OF THE PREFERRED EMBODIMENTS

Figure 1:
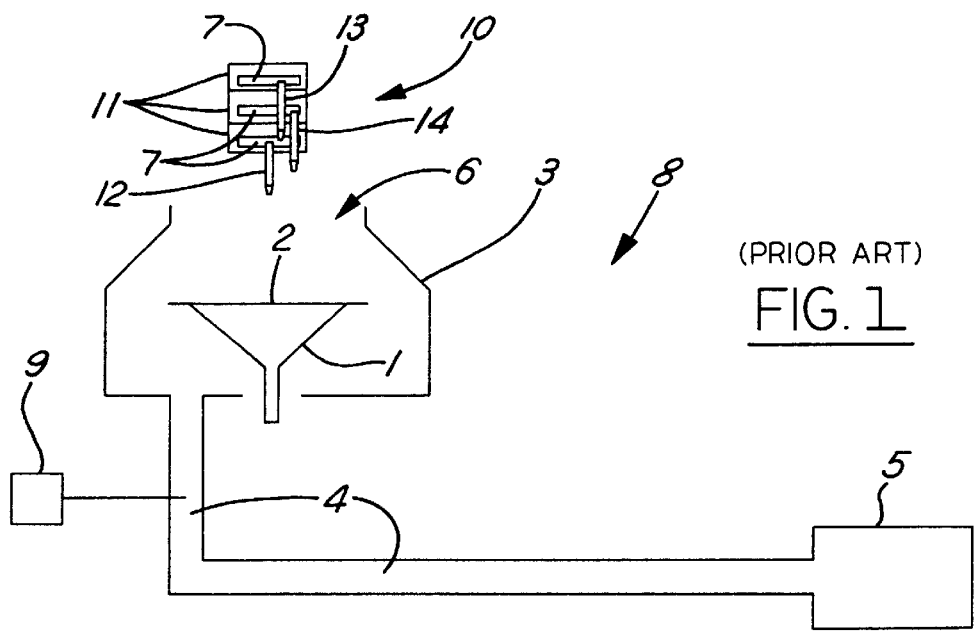
FIG. 1 is a schematic view of a typical conventional spin-coating apparatus for substrates.
Figure 2:
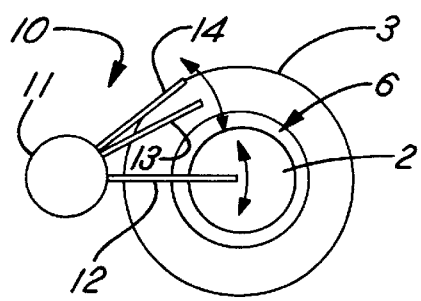
FIG. 2 is a top view of a typical conventional spin-coating apparatus.
Figure 3:
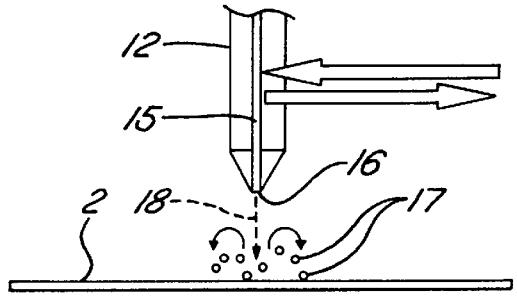
FIG. 3 is a schematic view illustrating removal of residual liquid from a substrate surface in operation of a typical conventional spin-coating apparatus.

The present invention has particularly beneficial utility in the removal of residual water or other liquid droplets from the surface of a semiconductor wafer substrate after spin-coated deposition of a photoresist layer on the substrate. However, the invention is not so limited in application, and while references may be made to such spin-coated apparatus, the present invention may be applicable to removing water or other liquids from surfaces in a variety of industrial and mechanical applications.

An illustrative embodiment of a spin coating apparatus which utilizes the nitrogen spray arm of the present invention is generally indicated by reference numeral 28 in FIG. 5. While the spin coating apparatus 28 has particular features hereinafter described, it is understood that the present invention may be equally applicable to spin coating apparatus or other process tools having features which depart from the following description. The spin coating apparatus 28 includes a coater cup 23 which is provided with a top opening 26 and partially encloses a wafer support stage or chuck 21 on which is supported a wafer substrate 22. A chemical dispensing system 30 includes a dual-nozzle gas spray arm 32 of the present invention, the details of which will be hereinafter described, and may additionally include an acid dispensing arm 47 and a deionized (DI) water spray arm 48, as well as additional fluid dispensing arms (not shown), each of which may extend from a corresponding arm slot 27 in an arm mount 31. Each of the arms 32, 47, 48 is engaged by an arm swinging mechanism (not shown) which may be conventional and is typically housed inside the chemical dispensing system 30. Accordingly, as shown in FIG. 6, each of the arms 32, 47, 48 is capable of swinging or pivoting from a stored, or "home", position on the side of the coater cup 23, over the top of the coater cup 23, in conventional fashion, for dispensing the corresponding fluid through the top opening 26 onto the wafer 22.

Figure 4:
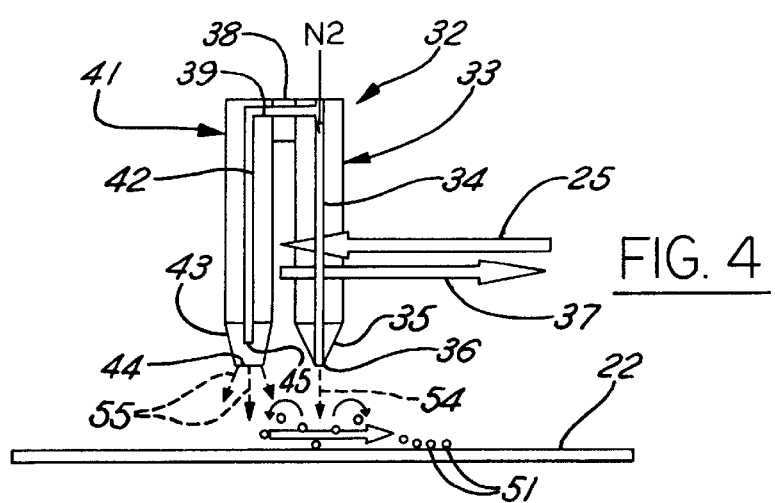
FIG. 4 is a schematic view illustrating removal of residual liquid from a substrate surface in implementation of the present invention.

As shown in FIG. 8, the dual-nozzle gas spray arm 32 of the present invention typically includes a primary spray arm 33 which is typically constructed of stainless steel. The primary spray arm 33 includes a horizontal segment 60 the proximal end 63 of which is engaged by the arm swinging mechanism (not shown) in the arm slot 27 of the dispensing system 30. A downward arm bend 61 in the primary spray arm 33 defines a vertical segment 62 which terminates in a primary spray nozzle 35. As shown in FIG. 4, a primary spray tube 34, which may be constructed of Teflon® (polytetrafluoroethylene), extends through the center of the primary spray arm 33 and is connected in fluid communication with a source (not shown) of inert gas, typically nitrogen, in the chemical dispensing system 30, typically in conventional fashion. The discharge end of the primary spray tube 34 terminates at a nozzle opening 36 in the primary spray nozzle 35. In a preferred embodiment, the nozzle opening 36 has a size of about 1 mm in diameter or width, but may alternatively have a larger or smaller size.

As further shown in FIGS. 4 and 8, a secondary spray arm 41, typically constructed of stainless steel, is mounted on the side of the primary spray arm 33 and includes a horizontal segment 64, a downward arm bend 65 and a vertical segment 66 which may be attached to those respective segments of the primary spray arm 33. The secondary spray arm 41 is confluently attached to the primary spray arm 33 typically through a connecting bridge 38, as illustrated in FIG. 4. Accordingly, a connecting tube 39, which may be constructed of Teflon® (polytetrafluoroethylene), confluently connects the primary spray tube 34 of the primary spray arm 33 to a secondary spray tube 42 which extends through the center of the secondary spray arm 41. As further shown in FIG. 4, the discharge end 45 of the secondary spray tube 42 terminates inside a secondary spray nozzle 43, provided on the end of the secondary spray arm 41, in spaced-apart relationship to a nozzle opening 44 in the secondary spray nozzle 43. In a preferred embodiment, the nozzle opening 44 has a diameter or width of about 4 mm, although the diameter or width may be smaller or larger, as desired. Typically, the nozzle opening 44 has a larger diameter or width than that of the nozzle opening 36 in the primary spray nozzle 35. In a typical embodiment, the primary spray tube 34, the connecting tube 39 and the secondary spray tube 42 each has a size of about 3 mm in diameter or width, although each of these elements may have a larger or smaller size.

In typical operation of the spin coating apparatus 28, the chuck 21 rotates the wafer 22 at high speeds, typically as high as 4,000 rpm, either after or as a liquid photoresist (not shown) is dispensed onto the center of the spinning wafer 22, through the top opening 26. By operation of centrifugal force imparted to the wafer 22 by the rotating chuck 21, the dispensed photoresist liquid is spread across and uniformly coated on the surface of the wafer 22. Exhaust solvent gases and photoresist particles generated during the process are vented from the coater cup 23 through an exhaust pipe 24 which may be connected to an exhaust manifold (not shown).

After the liquid photoresist is applied to the wafer 22, the acid dispensing arm 47 of the chemical dispensing system 30 sweeps over the center of the coater cup 23 and back to the "home" position on the side of the coater cup 23 as acid is dispensed from the arm 47 through the top opening 26 onto the surface of the spinning wafer 22 at a pressure of typically about 0.3 psi. This step removes excess photoresist, as well as photoresist particles, from the wafer 22. Next, the water spray arm 48 sweeps over the center of the coater cup 23 and back to the "home" position on the side of the coater cup 23 as DI water is sprayed from the arm 48 at a pressure of typically about 20–40 psi, through the top opening 26 and onto the wafer 22 to remove residual acid from the wafer 22. Because residual water remains on the wafer 22, the water must be removed from the water 22 prior to further processing thereof. Accordingly, the dual-nozzle gas spray arm 32 is initially positioned over the center of the coater cup 23, in the direction indicated by the arrow 25 in FIG. 4. Next, pressurized nitrogen gas is introduced into the primary spray arm 33 at a pressure of typically about 20 psi, flows through the primary spray tube 34, and is ejected from the nozzle opening 36 of the primary spray nozzle 35. The ejected nitrogen gas forms a narrow, relatively high velocity nitrogen gas stream 54 which strikes the surface of the wafer 22 and dislodges water droplets 51 remaining on the surface of the wafer 22 after the water rinsing step. While some of these water droplet 51 evaporate from the wafer 22, other water droplets "splash" onto the surrounding areas of the wafer 22. It is understood that the nitrogen gas may be ejected from the gas spray arm 32 both while the gas spray arm 32 is being swept from the "home position" at the side of the coater cup 3 to the center of the wafer 22, as indicated by the arrow 25, and as the gas spray arm 32 returns to the "home" position at the side of the coater cup 3, as indicated by the arrow 37.

As the pressurized nitrogen gas is ejected from the nozzle opening 36 of the primary spray nozzle 35, some of the pressurized nitrogen flows from the primary spray tube 34 and into the secondary spray tube 42 of the secondary spray arm 41, through the connecting tube 39. The nitrogen gas is thus ejected from the discharge end 45 of the secondary spray tube 42, where the nozzle opening 44 of the secondary spray nozzle 43 widens the spray path of the nitrogen gas to define relatively low-velocity, diffuse gas streams 55. The diffuse gas streams 55 contact a wider area on the surface of the wafer 22 than does the narrow, high-velocity gas stream 54 ejected from the primary spray nozzle 35. Accordingly, as the spray arm 32 begins to sweep back to the "home" position on the side of the coater cup 23, as indicated by the arrow 37, water droplets 51 remaining on the wafer 22 are blown and evaporated therefrom by the diffuse gas streams 55 of the secondary spray nozzle 43.

As shown in FIG. 7, the diffuse gas streams 55 ejected from the secondary spray nozzle 43 are effective in removing particles 52, as well as water droplets 51, from vias or other openings 57 formed in the surface of the wafer 22. This results in enhanced cleaning and drying of the wafer 22 and increases the yield of devices on the wafer 22.

While the preferred embodiments of the invention have been described above, it will be recognized and understood that various modifications can be made in the invention and the appended claims are intended to cover all such modifications which may fall within the spirit and scope of the invention.

What is claimed is:

1. A gas spray arm for a chemical dispensing system, comprising:
   a first spray arm having a first nozzle opening and a second spray arm having a second nozzle opening larger than said first nozzle opening provided in generally adjacent relationship to each other for receiving a gas;
   a first spray tube extending through said first spray arm and having a discharge end at said first nozzle opening; and
   a second spray tube extending through said second spray arm and having a discharge end spaced apart from said second nozzle opening.

2. The gas spray arm of claim 1 wherein said first spray arm and said second spray arm each comprises a generally horizontal segment, a generally vertical segment and an arm bend connecting said horizontal segment and said vertical segment.

3. The gas spray arm of claim 1 wherein said first spray arm and said second spray arm are confluently connected to each other.

4. The gas spray arm of claim 3 wherein said first spray arm and said second spray arm each comprises a generally horizontal segment, a generally vertical segment and an arm bend connecting said horizontal segment and said vertical segment.

5. The gas spray arm of claim 1 wherein each of said first spray tube and said second spray tube is polytetrafluoroethylene.

6. The gas spray arm of claim 5 wherein said first spray arm and said second spray arm each comprises a generally horizontal segment, a generally vertical segment and an arm bend connecting said horizontal segment and said vertical segment.

7. The gas spray arm of claim 1 wherein said first nozzle opening is at least about 1 mm in diameter.

8. The gas spray arm of claim 1 wherein said second nozzle opening is at least about 4 mm in diameter.

9. A gas spray arm for a chemical dispensing system, comprising:

primary and secondary spray arms provided in confluent relationship to each other for receiving a gas, wherein a portion of the gas flows from said primary spray arm to said secondary spray arm;

first and second spray nozzles provided on said primary and secondary spray arms, respectively;

first and second nozzle openings provided in said first and second spray nozzles, respectively, for ejecting a stream of the gas, with said second nozzle opening larger than said first nozzle opening;

a primary spray tube provided in said primary spray arm and having a discharge end at said first nozzle opening; and a secondary spray tube provided in said secondary spray arm and having a discharge end spaced apart from said second nozzle opening.

10. The gas spray arm of claim 9 wherein said first nozzle opening is at least about 1 mm in diameter and said second nozzle opening is at least about 4 mm in diameter.

11. A spin coating apparatus, comprising:

a coater cup having a top opening;

a substrate support provided in said coater cup for receiving a substrate;

primary and secondary spray arms provided in confluent relationship to each other for receiving a gas and positioning over said top opening, wherein a portion of the gas flows from said primary spray arm to said secondary spray arm;

a first nozzle opening provided in said primary spray arm and a second nozzle opening provided in said secondary spray arm and larger than said first nozzle opening for ejecting streams, respectively, of the gas through said top opening onto the substrate;

a primary spray tube provided in said primary spray arm and having a discharge end at said first nozzle opening; and a secondary spray tube provided in said secondary spray arm and having a discharge end spaced apart from said second nozzle opening.

12. The spin coating apparatus of claim 11 wherein said first nozzle opening is at least about 1 mm in diameter and said second nozzle opening is at least about 4 mm in diameter.

* * * * *